(12) United States Patent
Campbell et al.

(10) Patent No.: US 6,674,671 B1
(45) Date of Patent: Jan. 6, 2004

(54) CIRCUIT FOR LINES WITH MULTIPLE DRIVERS

(75) Inventors: Brian J. Campbell, Sunnyvale, CA (US); Tuan P. Do, San Jose, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/218,348

(22) Filed: Aug. 14, 2002

(51) Int. Cl.$^7$ ................................................. G11C 7/00
(52) U.S. Cl. ......................... 365/189.05; 365/189.02; 326/86; 326/87; 327/108
(58) Field of Search ................................. 327/108, 109; 326/83, 86, 87; 365/189.05, 189.02, 189.01

(56) References Cited

U.S. PATENT DOCUMENTS

| | | | |
|---|---|---|---|
| 4,390,988 A | 6/1983 | Best et al. | |
| 4,500,988 A | * 2/1985 | Bennett et al. | ................ 326/86 |
| 5,455,528 A | 10/1995 | Partovi et al. | |
| 5,455,802 A | 10/1995 | McClure | |
| 5,502,414 A | * 3/1996 | Tran et al. | ................... 327/434 |
| 5,568,076 A | 10/1996 | Petella et al. | |
| 5,646,558 A | 7/1997 | Jamshidi | |
| 5,789,966 A | 8/1998 | Bechade | |
| 5,896,046 A | 4/1999 | Bjorksten et al. | |
| 6,066,978 A | 5/2000 | Kadowaki | |
| 6,084,437 A | 7/2000 | Sako | |
| 6,090,153 A | 7/2000 | Chen et al. | |
| 6,122,217 A | 9/2000 | Keeth et al. | |
| 6,204,538 B1 | 3/2001 | Kim | |
| 6,271,713 B1 | * 8/2001 | Krishnamurthy | ............ 327/534 |

OTHER PUBLICATIONS

Weste, et al., "Principles of CMOS VLSI Design," A Systems Perspective, Addison–Wesley Publishing Company, Jun. 1988, 5 pages.

* cited by examiner

Primary Examiner—Son Mai
(74) Attorney, Agent, or Firm—Lawrence J. Merkel

(57) ABSTRACT

An apparatus may include at least a first transistor, a second transistor, and a circuit. The first transistor has a first control terminal coupled to receive a first dynamic data signal, and is coupled to a first node. The first transistor drives a first state on the first node responsive to an assertion of the first dynamic data signal. The second transistor is coupled to the first node and has a second control terminal. The second transistor is drives a second state on the first node responsive to a signal on the second control terminal. The circuit is coupled to generate the signal on the second control terminal and is coupled to receive a second dynamic data signal. The second dynamic data signal is a complement of the first dynamic data signal, wherein the circuit is activates the second transistor responsive to an assertion of the second dynamic data signal.

25 Claims, 6 Drawing Sheets

CIRCUIT FOR LINES WITH MULTIPLE DRIVERS

BACKGROUND OF THE INVENTION

1. Field of the Invention

This invention is related to the field of circuits for handling multiple possible drivers of a line.

2. Description of the Related Art

In circuit design, there are many uses for a line (or buses comprising multiple lines) which may have multiple drivers of the line. Generally, one of the drivers may drive the line at any given time. For example, memory arrays such as caches may employ such a structure for each bit read from the memory array. The memory array may include multiple banks, one of which may be read at any given time. Each bank has an output that may drive the line corresponding to the bit, and the bank that is being read drives the line. As another example, communication lines between two or more circuits may be driven by any of the circuits according to some protocol (often referred to as bi-directional lines, since the lines may be inputs or outputs of a given circuit at a given point in time).

FIG. 1 illustrates a first prior art circuit providing for multiple drivers of a line (the line is illustrated as carrying a $D_{out}$ signal in FIG. 1, and may be referred to herein as the $D_{out}$ line). The circuit of FIG. 1 may sometimes be referred to as a low swing, dual rail dynamic circuit. Each driver may drive a dynamic data signal and its complement (e.g. the dynamic data signal d0 and its complement d0# may be driven by a first driver and the dynamic data signal d1 and its complement d1# may be driven by a second driver). In FIG. 1, the dynamic data signals are precharged low and conditionally evaluate high dependent on whether or not the driver is driving a value and whether or not the value is a logical one or a logical zero. At most one driver may be permitted to drive its dynamic data signals at any given evaluation of the $D_{out}$ signal. For example, the driver corresponding to the dynamic data signals d0 and d0# may drive the line. If the value being driven is a logical one, the d0 dynamic data signal may assert. If the value is a logical zero, the d0# dynamic data signal may assert. Each dynamic data signal is coupled to the gate of an n-type metal oxide semiconductor (NMOS) transistor which is further coupled to one of two bit lines (bit and bit#). The bit and bit# lines are precharged to $V_{dd}$ using the PMOS transistors coupled to the precharge signal Pchg. One of the bit and bit# lines may be conditionally discharged by an NMOS transistor receiving an asserted dynamic data signal. A pair of PMOS transistors having gates coupled to bit and bit# lines and coupled to the opposite bit or bit# line may actively hold the precharge on the bit or bit# line which is not discharged by the NMOS transistors, responsive to the discharge of the bit or bit# line to which its gate is coupled. A sense amplifier (SA) is coupled to the bit and bit# lines and senses the differential between the two lines (responsive to the clock input SACLK) to generate the output line ($D_{out}$). Two additional NMOS transistors may be added for each additional driver (having gates coupled to receive the dynamic data signal and its complement from that driver).

FIG. 2 illustrates a second prior art circuit which may be used to handle multiple drivers of a line ($D_{out}$). The circuit of FIG. 2 may sometimes be referred to as a single-rail dynamic circuit. In FIG. 2, each driver may drive a dynamic data signal (e.g. the dynamic data signal d0 may be driven by a first driver and the dynamic data signal d1 may be driven by a second driver). Similar to FIG. 1, the dynamic data signals are precharged low in this embodiment and conditionally evaluate high if the corresponding driver is driving $D_{out}$ and the value being driven is a binary one. Each dynamic data signal is coupled to the gate of an NMOS transistor, which discharges the internal node N1 in response to the dynamic data signal asserting. A precharge PMOS transistor is coupled to the node N1 and precharges the node N1 to $V_{dd}$ responsive to the precharge signal Pchg. An inverter is coupled between the node N1 and the output $D_{out}$, and a feedback PMOS transistor has a gate terminal coupled to $D_{out}$ and coupled to the node N1 to maintain the precharge state if the NMOS transistors do not discharge the node N1. Thus, an output $D_{out}$ of binary zero is supplied via the precharge if there are no drivers or if the driver is driving a binary zero (and thus does not assert its dynamic data signal). An output $D_{out}$ of binary one is supplied if the driver is driving a binary one (and thus asserts its dynamic data signal). Each additional driver may be handled by adding an NMOS transistor in parallel with those shown in FIG. 2 and coupled to receive the dynamic data signal from the additional driver.

FIG. 3 illustrates a third prior art circuit which may be used to handle multiple drivers of a line ($D_{out}$). The circuit of FIG. 3 may sometimes be referred to as a static push/pull circuit. The circuit of FIG. 3 takes static inputs (the complement of the data being driven, d0# or d1#, and a select line sel0 or sel1) from each potential driver of the line. The driver of the line asserts its select line sel0 or sel1 and provides the data to be driven on the complement data signal d0# or d1#. The first driver (d0# and sel0) is handled via a NAND gate 10, a PMOS transistor 12, a NOR gate 16, and an NMOS transistor 18. The NAND gate 10 is coupled to receive the sel0 signal and the d0# signal, and is coupled to the gate of a PMOS transistor 12, which is coupled to the input of an inverter 14. The NOR gate 16 is coupled to receive the sel0 signal (on an inverting input) and the d0# signal, and is coupled to the gate of the NMOS transistor 18, which is coupled to the input of the inverter 14. If the d0# signal is a one (the data is a zero) and the select signal is a one, the NAND gate 10 activates the PMOS transistor 12, driving the input of the inverter 14 to a one and thus $D_{out}$ to a zero. If the d0# signal is a zero and the select signal is a one, the NOR gate 16 activates the NMOS transistor 18, driving the input of the inverter to a zero and thus $D_{out}$ to a one. If the select line is a zero, then neither of the PMOS or NMOS transistors 12 or 18 is activated. A similar circuit handles the second driver (d1# and sel1), and additional circuits may be added to handle additional drivers.

FIG. 4 illustrates a fourth prior art circuit which may be used to handle multiple drivers of a line ($D_{out}$). The circuit of FIG. 4 may sometimes be referred to as static tristate inverters. A first tristate inverter corresponds to the first driver (d0 and sel0) and includes PMOS transistors 20 and 22 in a stack and NMOS transistors 24 and 26 in a stack. The PMOS transistor 20 has its gate coupled to the d0 signal, while the PMOS transistor 22 has its gate coupled to receive the inverse of the sel0 signal. The NMOS transistor 24 has its gate coupled to receive the sel0 signal, and the NMOS transistor 26 has its gate coupled to the d0 signal. Essentially, the transistors 22 and 24 activate if the sel0 signal is asserted, and one of the transistors 20 or 26 activates in response to the data signal d0. Thus, either a binary zero is driven on $D_{out}$ by transistors 20 and 22 through the inverter 28 if the sel0 signal is asserted and d0 is a zero, or a binary one is driven on $D_{out}$ by transistors 24 and 26 through the inverter 28 if the sel0 signal is asserted and d0 is a one. If the sel0 signal is deasserted, then the tri-state inverter does not drive the inverter 28. A similar circuit is used for the second driver (d1 and sel1), and additional circuits may be added to handle additional drivers.

SUMMARY OF THE INVENTION

In one embodiment, an apparatus includes at least a first transistor, a second transistor, and a circuit. The first transistor has a first control terminal coupled to receive a first dynamic data signal, and is coupled to a first node. The first transistor is configured to drive a first state on the first node responsive to an assertion of the first dynamic data signal. The second transistor is coupled to the first node and has a second control terminal. The second transistor is configured to drive a second state on the first node responsive to a signal on the second control terminal. The circuit is coupled to generate the signal on the second control terminal and is coupled to receive a second dynamic data signal. The second dynamic data signal is a complement of the first dynamic data signal, wherein the circuit is configured to activate the second transistor responsive to an assertion of the second dynamic data signal.

A memory array may include a plurality of banks of memory, each bank configured to output a first dynamic data signal indicative of a bit stored in the bank and a second dynamic data signal indicative of the complement of the bit. The memory array may further include a bank select circuit coupled to receive the first dynamic data signal and the second dynamic data signal from each of the plurality of banks and configured to output a selected bit responsive to the first dynamic data signal and the second dynamic data signal from each of the plurality of banks. The bank select circuit comprises a first plurality of transistors, each having a control terminal coupled to receive the first dynamic data signal from a respective one of the plurality of banks. Each of the first plurality of transistors is coupled to a first node and is configured to drive a first state on the first node responsive to an assertion of the first dynamic data signal. A second transistor is coupled to the first node and has a second control terminal. The second transistor is configured to drive a second state on the first node responsive to a signal on the second control terminal. Coupled to generate the signal on the second terminal and coupled to receive the second dynamic data signal from each of the plurality of banks, a circuit is configured to activate the second transistor responsive to an assertion of the second dynamic data signal from one of the plurality of banks.

BRIEF DESCRIPTION OF THE DRAWINGS

The following detailed description makes reference to the accompanying drawings, which are now briefly described.

Figure 1:
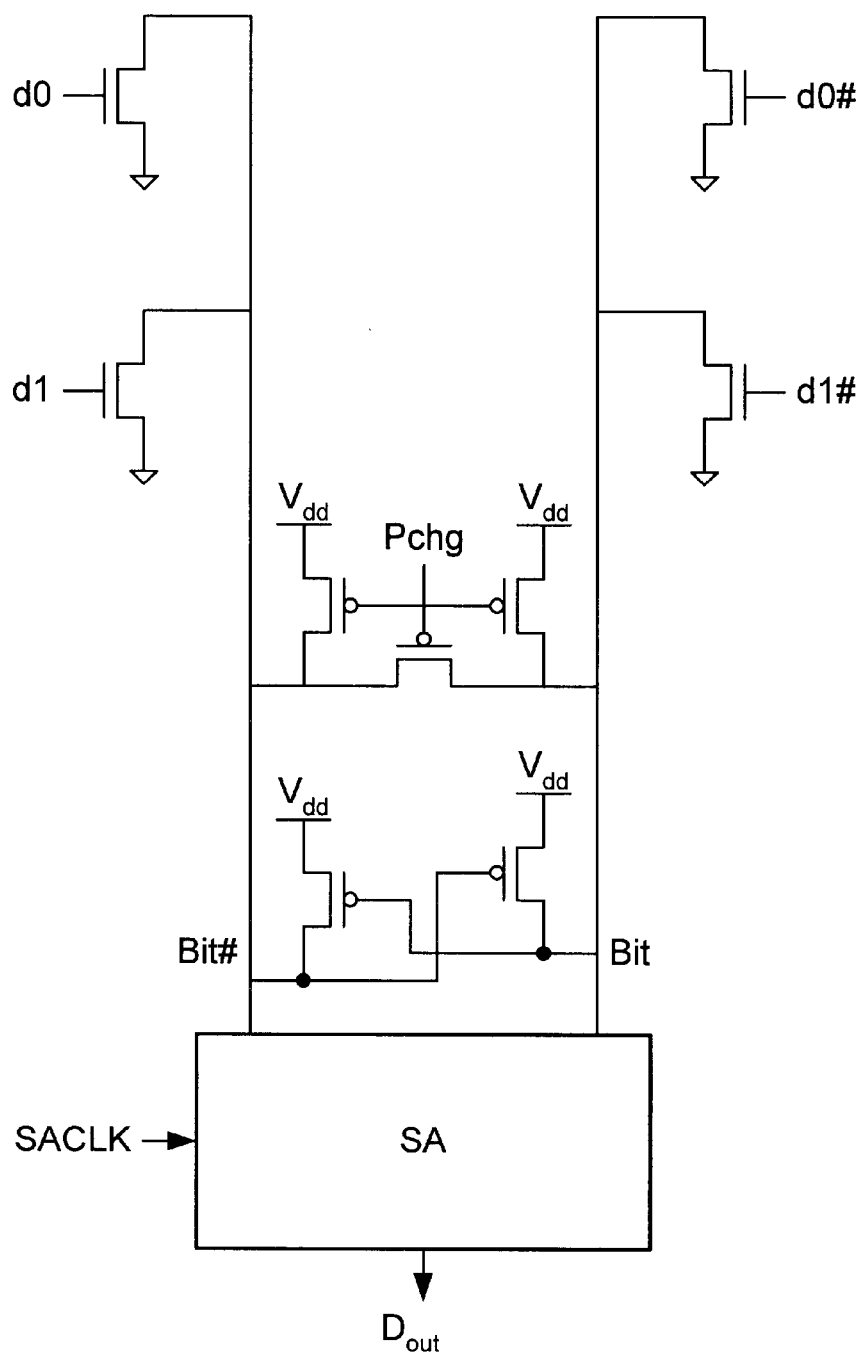
FIG. 1 is a circuit diagram of a first prior art circuit.
Figure 2:
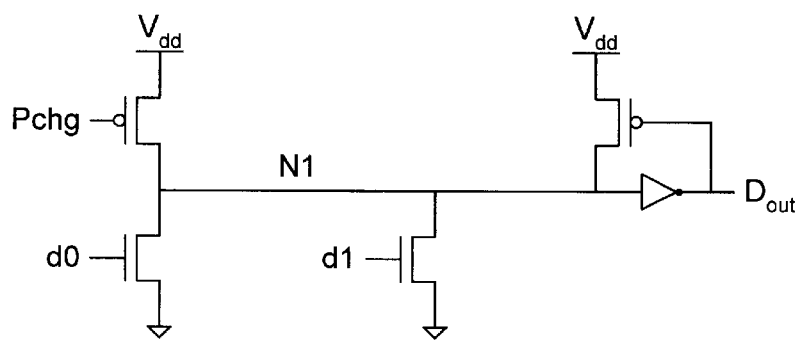
FIG. 2 is a circuit diagram of a second prior art circuit.
Figure 3:
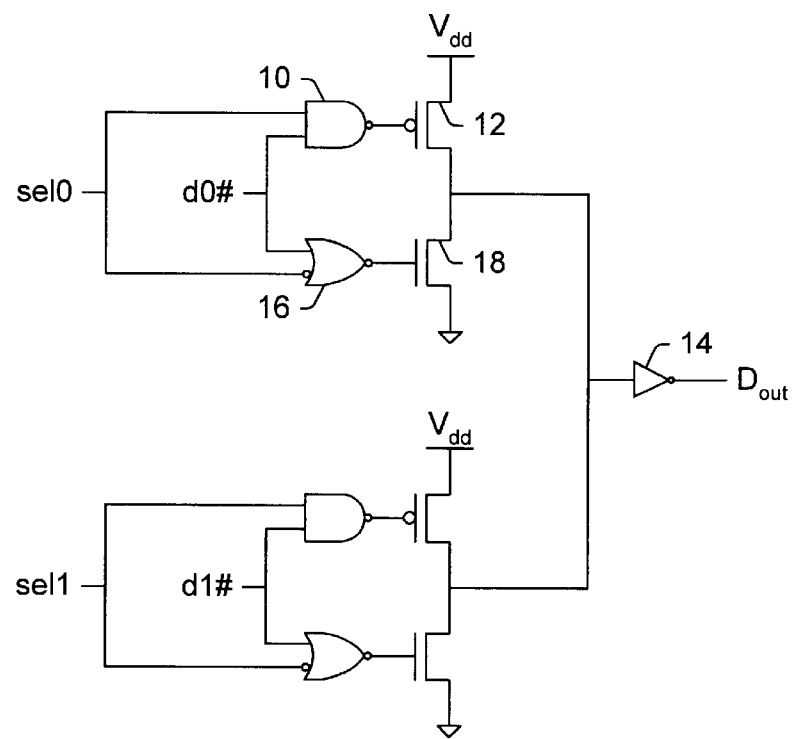
FIG. 3 is a circuit diagram of a third prior art circuit.
Figure 4:
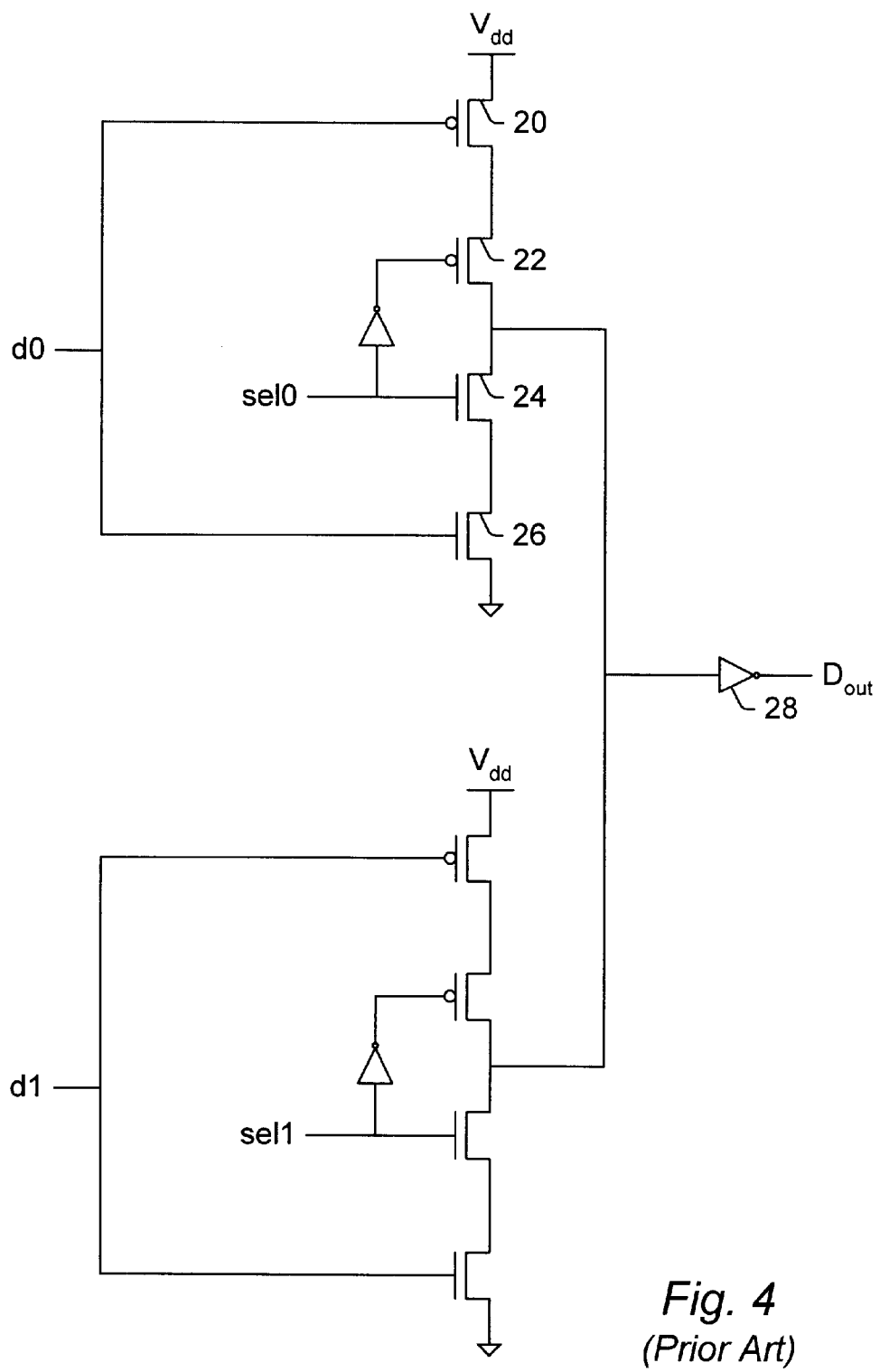
FIG. 4 is a circuit diagram of a fourth prior art circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Figure 5:
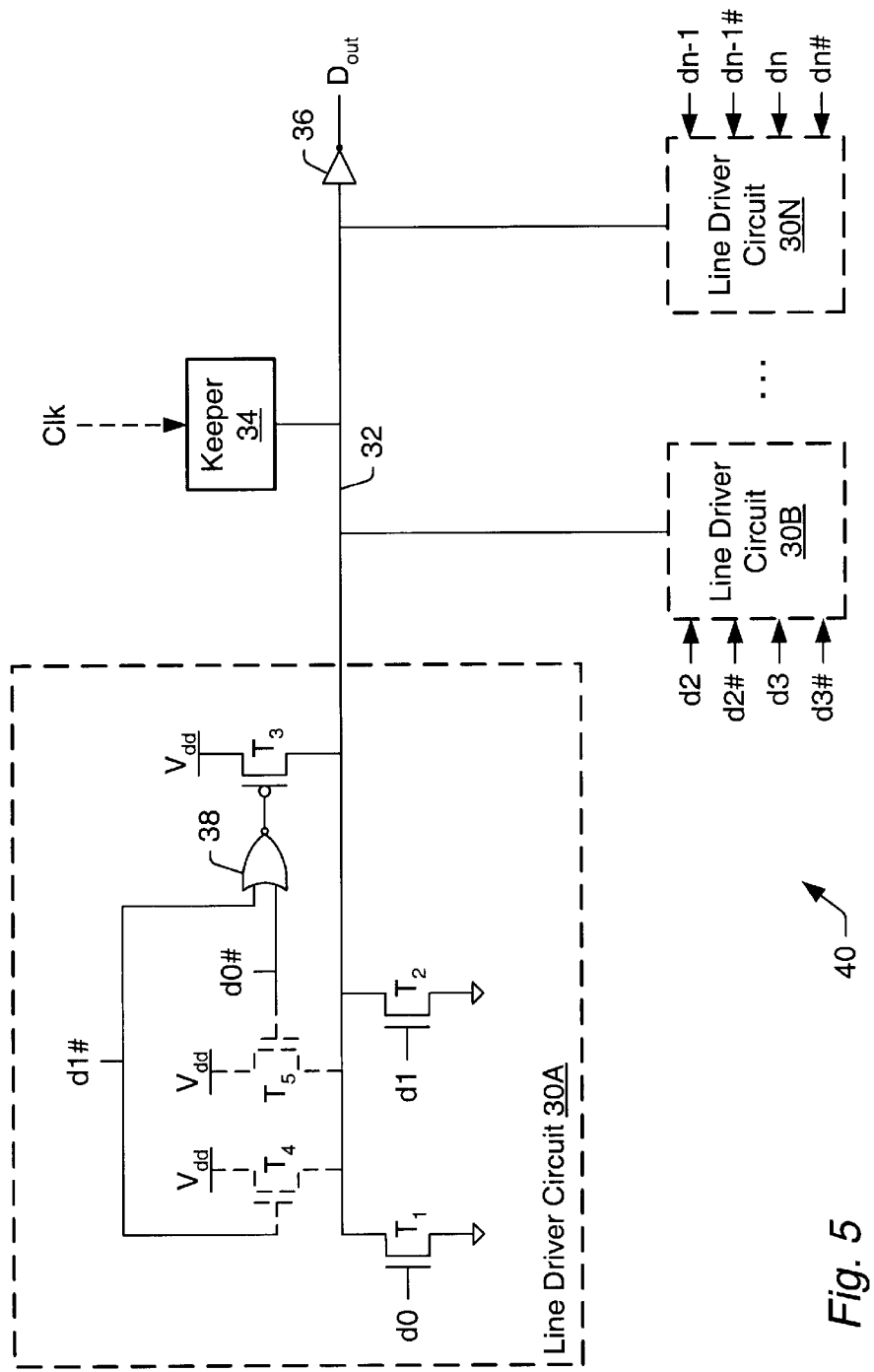
FIG. 5 is a circuit diagram of one embodiment of a circuit for handling multiple drivers of a line.

Turning now to FIG. 5, a circuit diagram of one embodiment of a circuit 40 for handling multiple drivers of a line is shown. Other embodiments are possible and contemplated. In the embodiment of FIG. 5, the circuit 40 includes one or more line driver circuits (e.g. the line driver circuits 30A, 30B, and 30N in FIG. 5). Each line driver circuit 30A–30N is coupled to receive one or more dynamic data signals and their complements (e.g. d0, its complement d0#, d1, and its complement d1# is received by the line driver circuit 30A). Each of the line driver circuits 30A–30N are coupled to a node 32, to which a keeper circuit 34 and an inverter 36 are coupled. The inverter 36 drives the data output of the circuit ($D_{out}$).

The line driver circuit 30A is illustrated in more detail in FIG. 5 for one embodiment. The line driver circuits 30B–30N may be configured similarly. Particularly, the line driver circuit 30A includes transistors $T_1$, $T_2$, and $T_3$, and a NOR gate 38 in the illustrated embodiment. The transistors $T_1$ and $T_2$ may be NMOS transistors, and the transistor $T_3$ may be a PMOS transistor. The transistor $T_1$ has a gate coupled to receive the d0 signal, a drain coupled to the node 32, and a source coupled to ground. The transistor $T_2$ has a gate coupled to receive the d1 signal, a drain coupled to the node 32, and a source coupled to ground. The transistor $T_3$ has a gate coupled to the output of the NOR gate 38, a source coupled to $V_{dd}$, and a drain coupled to the node 32. The NOR gate 38 has inputs coupled to receive the d0# and d1# signals.

Generally, a different driver may correspond to each of the pairs of dynamic data signals (e.g. a first driver may correspond to the dynamic data signals d0 and d0#, and a second driver may correspond to the dynamic data signals d1 and d1#). If a given driver is driving $D_{out}$, it drives the data bit to be transmitted as $D_{out}$ on its pair of dynamic data signals. Generally, a dynamic signal is a signal having dynamic behavior. That is, the signal has a precharge phase and an evaluate phase. During the precharge phase, the signal is precharged to a first state. During the evaluate phase, the signal optionally evaluates to a second state. For example, in the embodiment of FIG. 5, the dynamic data signals may be precharged low and may evaluate high. If a dynamic data signal (e.g. d0) evaluates high, the data bit d0 is a logical one. If the complement dynamic data signal (e.g. d0#) evaluates high, the data bit d0 is a logical zero. If neither dynamic data signal evaluates high, the corresponding driver is not driving the $D_{out}$ during that evaluation phase of the dynamic data signals. In other embodiments, the dynamic data signals may precharge high and optionally evaluate low. A dynamic data signal may be referred to as asserting if, during the evaluation phase, the dynamic data signal evaluates to the second state. A first dynamic data signal is the complement of a second dynamic data signal if the first dynamic data signal, when asserted during the evaluate phase, is indicative of the binary inverse of a data bit that the second dynamic data signal is indicative of, when asserted during the evaluate phase.

When the dynamic data signals are in their precharge state (either during the precharge phase or during the evaluate phase, if the corresponding drivers are not driving the $D_{out}$ signal), the line driver circuit 30A may be idle. That is, the transistors $T_1$ and $T_2$ are inactive due to the precharge state on the d0 and d1 signals. The d0# and d1# signals, in their precharge state, cause the NOR gate 38 to output a logical one (or $V_{dd}$), and thus the transistor $T_3$ is inactive. In the illustrated embodiment, the keeper 34 retains the previous state on the node 32. The keeper 34 may, in one embodiment, comprise a pair of cross-coupled inverters. One of the inverters may have a relatively weak drive strength (compared to, e.g., transistors $T_1$, $T_2$, and $T_3$), and that output (and the input of the second inverter) may be coupled to the node 32. The keeper 34 may supply current to offset any leakage current which may be experienced by the node 32. In other embodiments, the keeper 34 may be eliminated, or may have any other construction. In one particular embodiment, the keeper 34 may be coupled to receive a clock (Clk in FIG. 5) from which the precharge phase and evaluate phase of the dynamic data signals are derived. The keeper 34 may be inactive during the evaluate phase so that the keeper 34 does not resist the operation of the transistors $T_1$–$T_5$ on the node 32. While the clock Clk is one indication of the evaluate phase, in other embodiments, the keeper 34 may receive any other indication of the evaluate phase. The keeper 34 receiving the clock or other signal and being inactive during the evaluate phase may be optional and may not be implemented in some embodiments.

If a driver is driving the $D_{out}$ line during a given evaluation phase, the driver asserts one of its pair of dynamic data signals based on the bit to be driven. For example, if the first driver (corresponding to the d0 and d0# dynamic data signals) is driving a logical one, the first driver asserts the d0 dynamic data signal. The assertion of the d0 dynamic data signal activates the transistor $T_1$, thus driving a state on the node 32 (a binary zero, or ground voltage, in this embodiment) which causes a logical one on the output $D_{out}$ (through the inverter 36). If the first driver is driving a logical zero, the first driver asserts the d0# dynamic data signal. The assertion of the d0# signal causes the NOR gate 38 to evaluate to a logical zero (or ground voltage), which activates the transistor $T_3$ and drives a state on the node 32 (a binary one, or $V_{dd}$ voltage, in this embodiment) which causes a logical zero on the output $D_{out}$ (through the inverter 36). The second driver (corresponding to the d1 and d1# signals) operates in a similar fashion.

In some embodiments, the line driver circuit 30A as illustrated in FIG. 5 may consume relatively little power. The embodiment of the line driver circuit 30A shown in FIG. 5 includes relatively few transistors, as a function of the number of drivers, which may lead to relatively low power consumption. Additionally, the line driver circuit 30A illustrated in FIG. 5 may avoid precharging, select lines, senseamplifiers, and other circuitry which may serve to increase the power consumption and complexity of the circuit.

The transistors of the illustrated line driver circuit 30A which drive the node 32 are single-stacked (i.e. not stacked with other transistors), which may lead to a rapid response time on the node 32 to inputs to these transistors. The inputs to the line driver circuit 30A as shown in FIG. 5 pass through a NOR gate 38 in order to activate the transistor $T_3$. In order to speed the transition of the node 32 in some embodiments, the transistors $T_4$ and $T_5$ may optionally be included. The transistors $T_4$ and $T_5$ are NMOS transistors. The transistor $T_4$ has a gate coupled to receive the d1# dynamic data signal, a source coupled to $V_{dd}$, and a drain coupled to the node 32. The transistor $T_5$ has a gate coupled to receive the d0# dynamic data signal, a source coupled to $V_{dd}$, and a drain coupled to the node 32. In response to an assertion of the corresponding dynamic data signal d1# or d0#, the transistor $T_4$ or $T_5$ activates and begins charging the node 32 toward $V_{dd}$. After the delay through the NOR gate 38, the transistor $T_3$ is activated in response to the assertion of the d0# or d1# dynamic data signal, and the transistor $T_3$ completes the transition to $V_{dd}$ (logical one) on the node 32.

In the illustrated embodiment, the circuit converts dynamic data signals to static signals on the output, with the keeper circuit 34 latching the static data signal and holding the static data signal after the input dynamic data signals are precharged. In such an embodiment, subsequent conversion circuitry may be avoided.

Additional line driver circuits (e.g. the line driver circuits 30B–30N in FIG. 5) may be included and coupled to the node 32 to handle additional drivers of the output $D_{out}$. The additional line driver circuits may present additional load to be driven in order to change the state of the node 32, but the additional load may be relatively small in some embodiments (one NMOS transistor per additional driver, and a PMOS transistor shared by at least two drivers). While the embodiment shown illustrates two additional line driver circuits, other embodiments may include even more line driver circuits to handle the desired number of drivers.

It is noted that, in some embodiments, it may be desirable to skew the NOR gate 38 for the pulldown transition (that is, design the NOR gate 38 such that the pulldown transition is more rapid that the pullup transition). The pullup transition may be less critical, since that transition deactivates the transistor $T_3$ after the node 32 has been charged. The pulldown delay through the NOR gate 38 may be about ½ gate delay if such skewing is performed, for example.

Figure 6:
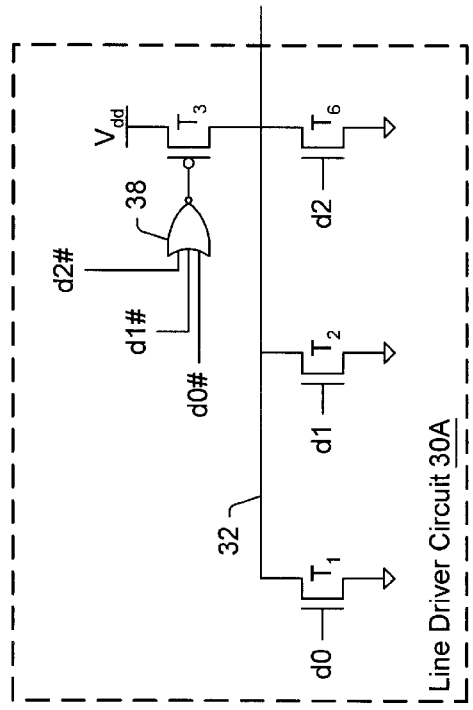
FIG. 6 is a circuit diagram of a second embodiment of a line driver circuit shown in FIG. 5.
Figure 8:
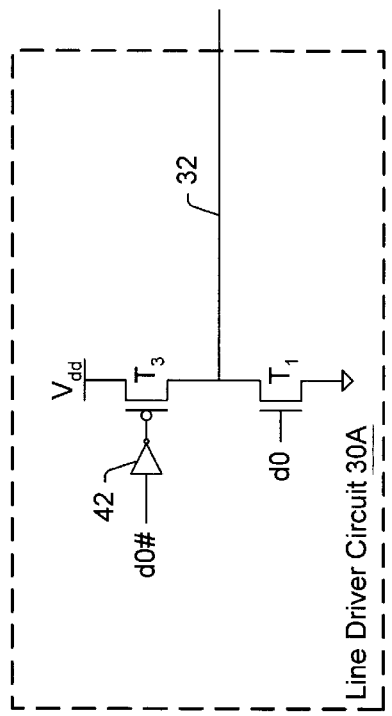
FIG. 8 is a circuit diagram of a fourth embodiment of the line driver circuit shown in FIG. 5.
Figure 7:
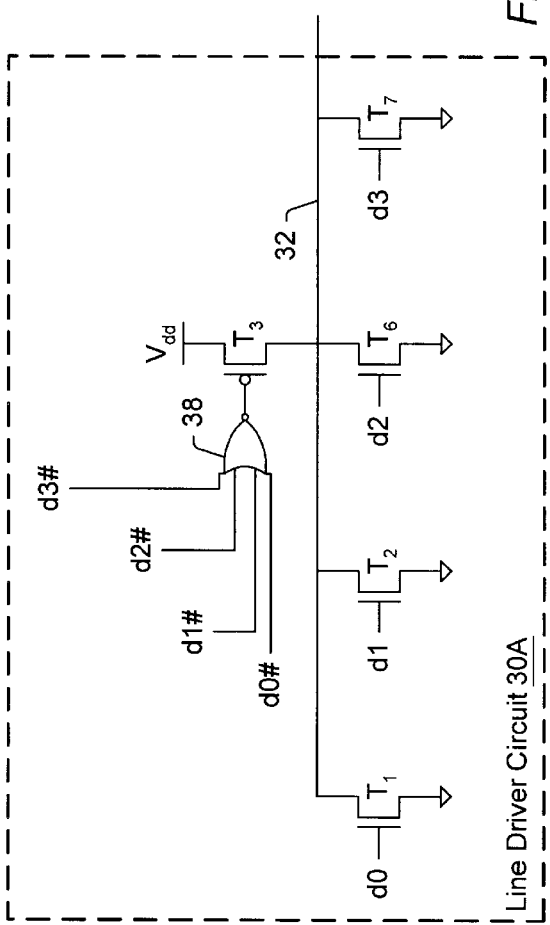
FIG. 7 is a circuit diagram of a third embodiment of a line driver circuit shown in FIG. 5.

While the embodiment of the line driver circuit 30A receives two pairs of dynamic data signals (and additional line driver circuits 30B–30N are used to handle additional dynamic data signals), in other embodiments a line driver circuit may receive more or fewer pairs of dynamic data signals. For example, FIG. 6 is an embodiment of the line driver circuit 30A which receives 3 pairs of dynamic data signals (d0 and d0#, d1 and d1#, and d2 and d2#). The embodiment of FIG. 6 includes an additional input on the NOR gate 38 to receive the d2# dynamic data signal and an additional transistor $T_6$ having a gate coupled to receive the d2 dynamic data signal, a source coupled to ground, and a drain coupled to the node 32. Additional line driver circuits 30B–30N may be included in the circuit 40 to handle additional pairs of dynamic data signals in excess of the three. FIG. 7 is another embodiment of the line driver circuit 10A which receives 4 pairs of dynamic data signals (d0 and d0#, d1 and d1#, d2 and d2#, and d3 and d3#). The embodiment of FIG. 7 includes the additions of the embodiment of FIG. 6 as well as yet another input on the NOR gate 38 to receive the d3# dynamic data signal and a transistor $T_7$ having a gate coupled to receive the d3 dynamic data signal, a source coupled to ground, and a drain coupled to the node 32. Additional line driver circuits 30B–30N may be included in the circuit 40 to handle additional pairs of dynamic data signals in excess of four. FIG. 8 is still another embodiment of the line driver circuit 30A which handles a single pair of dynamic data signals. The transistor $T_1$ is included, coupled to the dynamic data signal d0, and the transistor $T_3$ is included. In this case, the circuit supplying the gate of the transistor $T_3$ is an inverter 42 coupled to receive the d0# signal, thus activating the transistor $T_3$ if the d0# signal is asserted. Additional line driver circuits 30B–30N may be included in the circuit 40 to handle each additional pair of dynamic data signals. The embodiments of the line driver circuit 30A shown in FIGS. 5–8 may be combined in a circuit 40 to handle the desired number of drivers of the $D_{out}$ line (e.g. 5 drivers may be handled by a combination of the embodiment of the line driver circuit 30A shown in FIG. 5 and the embodiment shown in FIG. 6 coupled to the node 32, by a combination of the embodiment shown in FIG. 7 and the embodiment shown in FIG. 8 coupled to the node 32, by a combination of five of the embodiments shown in FIG. 8, etc.).

While a NOR gate 38 is shown in the embodiments of FIGS. 5, 6, and 7, other embodiments may employ any circuitry which accomplishes a NOR function on the dynamic data inputs. Any Boolean equivalents of a NOR gate may be used.

It is noted that the complementary line driver circuit to that illustrated in FIGS. 5–8 may also be used. In one such embodiment, which may be used if the dynamic data signals were precharged high and evaluate low, the transistors $T_1$ and $T_2$ would be PMOS transistors having sources coupled to $V_{dd}$, the transistor $T_3$ would be an NMOS transistor having a source coupled to ground, and the NOR gate 38 would be a NAND gate. In another such embodiment, which may be used if the dynamic data signals are precharged low and evaluate high, the transistors $T_1$ and $T_2$ would be PMOS transistors having sources coupled to $V_{dd}$, the transistor $T_3$ would be an NMOS transistor having a source coupled to ground, the NOR gate 38 may be an OR gate, and inverters may be inserted between the dynamic data inputs and the gates of the transistors $T_1$ and $T_2$.

It is noted that, while NMOS and PMOS transistors are illustrated in FIGS. 5–8, other types of transistors may be used. Generally, a transistor may have at least two terminals and a control terminal which controls conduction between the two terminals. For example, MOS transistors include gate, source, and drain terminals. Conduction between the source and drain terminals may be controlled by the gate terminal.

It is noted that, while a single bit $D_{out}$ is illustrated in FIG. 5, multiple circuits similar to the circuit 40 may be used in parallel to provide a multi-bit bus for multi-bit values.

Figure 9:
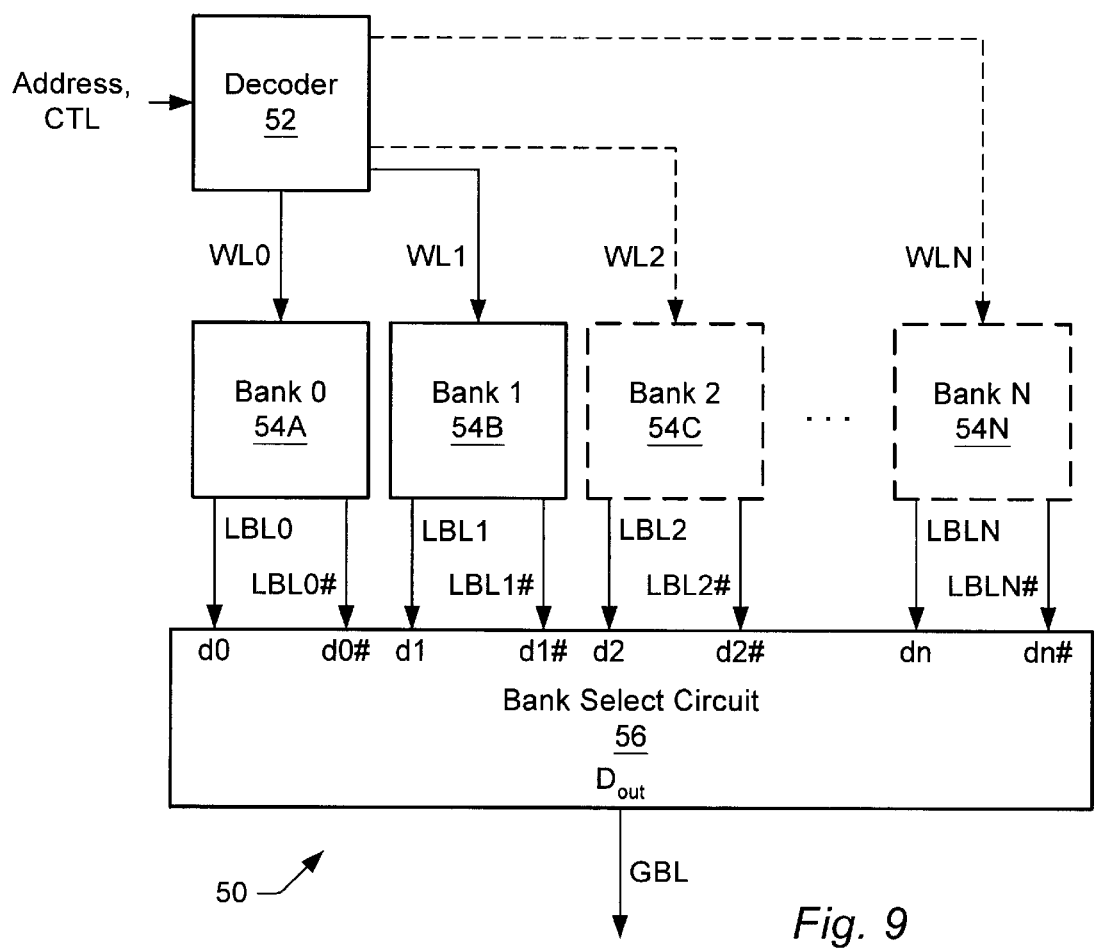
FIG. 9 is a block diagram of one embodiment of a memory array employing the circuit shown in FIG. 5.

Turning now to FIG. 9, a block diagram of one embodiment of a memory array 50 is shown. Other embodiments are possible and contemplated. In the illustrated embodiment, the memory array 50 includes a decoder 52, a plurality of memory banks 54A–54N, and a bank select circuit 56. The decoder 52 is coupled to receive an address and/or control information for an access to the memory array 50. The decoder 52 decodes the received information and activates a word line to one of the memory banks 54A–54N to be accessed. The decoder 52 may provide a set of word lines to each bank 54A–54N (e.g. WL0 to the bank 54A, WL1 to the bank 54B, WL2 to the bank 54C, and WLN to the bank 54N). A first bit output by each bank is illustrated in FIG. 8 as a pair of complementary dynamic data signals referred to as local bit lines (LBL). Thus, bank 54A outputs an LBL0 and an LBL0# signal; the bank 54B outputs an LBL1 and an LBL1# signal; the bank 54C outputs an LBL2 and an LBL2# signal; and the bank 54N outputs an LBLN and an LBLN# signal. The bank select circuit 56 is coupled to receive the local bit line signals from each of the banks 54A–54N and outputs a global bit line (GBL).

The set of word lines to a given bank 54A–54N may comprise one word line for each storage location in the bank. If a particular word line is activated, the bank 54A–54N outputs the value from the corresponding storage location. If no word lines are activated to a given bank, that bank 54A–54N may not output a value (i.e. its local bit lines may remain deasserted). Thus, the separate sets of word lines for each bank may act as a bank select among the banks. Alternatively, a single set of word lines may be shared among the banks and a bank select line may be used by the decoder 52 or other circuitry to select the bank to output a value. Any bank selection mechanism may be used.

The bank select circuit 56 may comprise the circuit 40 shown in FIG. 5. The inputs and outputs of the circuit 40 are labeled on the bank select circuit 56. Thus, the LBL0 and LBL0# signals may be the d0 and d0# inputs to the circuit 40, etc., and the $D_{out}$ output may be the global bit line GBL. Thus, the bank select circuit 56 may select among the multiple banks (multiple possible drivers of the global bit line GBL) to output on the global bit line GBL in a given memory access. While a single bit line is shown in FIG. 9, multiple bank select circuits 56 may be used in parallel, coupled to different pairs of dynamic local bit line signals from the banks 54A–54N, to output a multi-bit value from a selected bank. In various embodiments, the memory array 50 may comprise at least two banks, or any number of banks greater than two.

Figure 10:
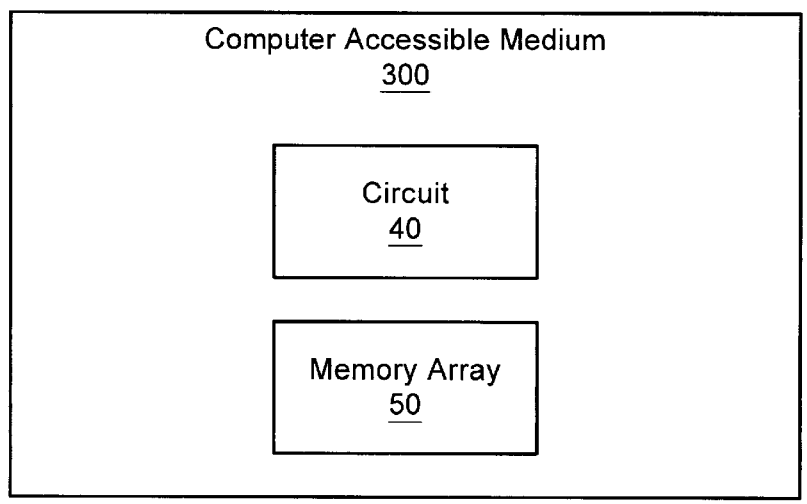
FIG. 10 is a block diagram of one embodiment of a computer accessible medium.

Turning next to FIG. 10, a block diagram of a computer accessible medium 300 including one or more data structures representative of the circuit 40 and/or the memory array 50 is shown. Generally speaking, a computer accessible medium may include storage media such as magnetic or optical media, e.g., disk, CD-ROM, or DVD-ROM, volatile or non-volatile memory media such as RAM (e.g. SDRAM, RDRAM, SRAM, etc.), ROM, etc., as well as media accessible via transmission media or signals such as electrical, electromagnetic, or digital signals, conveyed via a communication medium such as a network and/or a wireless link.

Generally, the data structure(s) of the circuitry on the computer accessible medium 300 may be read by a program and used, directly or indirectly, to fabricate the hardware comprising the circuitry. For example, the data structure(s) may include one or more behavioral-level descriptions or register-transfer level (RTL) descriptions of the hardware functionality in a high level design language (HDL) such as Verilog or VHDL. The description(s) may be read by a synthesis tool which may synthesize the description to produce one or more netlist(s) comprising lists of gates from a synthesis library. The netlist(s) comprise a set of gates which also represent the functionality of the hardware comprising the circuitry. The netlist(s) may then be placed and routed to produce one or more data set(s) describing geometric shapes to be applied to masks. The masks may then be used in various semiconductor fabrication steps to produce a semiconductor circuit or circuits corresponding to the circuitry. Alternatively, the data structure(s) on computer accessible medium 300 may be the netlist(s) (with or without the synthesis library) or the data set(s), as desired. In yet another alternative, the data structures may comprise the output of a schematic program, or netlist(s) or data set(s) derived therefrom.

While computer accessible medium 300 includes a representation of the circuit 40 and/or the memory array 50, other embodiments may include a representation of any portion of the circuit 40 (e.g. one or more line driver circuits 30A–30N, keeper 34, inverter 36, transistors within a line driver circuit 30A–30N, etc.) or the memory array 50 (e.g. one or more memory banks 54A–54N, decoder 52, bank select circuits 56, etc.).

Numerous variations and modifications will become apparent to those skilled in the art once the above disclosure is fully appreciated. It is intended that the following claims be interpreted to embrace all such variations and modifications.

What is claimed is:

1. An apparatus comprising:
   a source circuit configured to generate a first dynamic data signal and a second dynamic data signal that is a complement of the first dynamic data signal;
   a first transistor having a first control terminal coupled to receive the first dynamic data signal, wherein the first transistor is coupled to a first node and is configured to drive a first state on the first node responsive to an assertion of the first dynamic data signal;
   a second transistor coupled to the first node and having a second control terminal, the second transistor configured to drive a second state on the first node responsive to a signal on the second control terminal; and
   a circuit coupled to receive the second dynamic data signal, and configured to generate the signal on the second control terminal responsive to the second dynamic data signal, wherein the circuit is configured to activate the second transistor responsive to an assertion of the second dynamic data signal.

2. An apparatus comprising:
   a first plurality of transistors, each of the first plurality of transistors having a control terminal coupled to receive a respective one of a first plurality of dynamic data signals, wherein each of the first plurality of transistors is coupled to a first node and is configured to drive a first state on the first node responsive to an assertion of the respective one of the first plurality of dynamic data signals;
   a second transistor coupled to the first node and having a second control terminal, the second transistor configured to drive a second state on the first node responsive to a signal on the second control terminal; and
   a circuit coupled to generate the signal on the second control terminal and coupled to receive, a second plurality of dynamic data signals, wherein each of the second plurality of dynamic data signals is a complement of a respective one of the first plurality of dynamic data signals, and wherein the circuit is configured to activate the second transistor responsive to an assertion of one of the second plurality of dynamic data signals.

3. The apparatus as recited in claim 2 wherein the circuit performs a logical NOR of the second plurality of dynamic data signals.

4. The apparatus as recited in claim 3 wherein the circuit is a NOR gate.

5. The apparatus as recited in claim 2 further comprising a second plurality of transistors, each having a control terminal coupled to receive a respective one of the second plurality of dynamic data signals, and each of the second plurality of transistors coupled to the first node.

6. The apparatus as recited in claim 5 wherein the second transistor is a PMOS transistor.

7. The apparatus as recited in claim 6 wherein the second plurality of transistors are each NMOS transistors.

8. The apparatus as recited in claim 7 wherein the first plurality of transistors are each NMOS transistors.

9. The apparatus as recited in claim 1 further comprising an inverter having an input coupled to the first node and driving an output signal representing the value represented by an asserted one of the first dynamic data signal or the second dynamic data signal.

10. An apparatus comprising:
    a first transistor having a first control terminal coupled to receive a first dynamic data signal, wherein the first transistor is coupled to a first node and is configured to drive a first state on the first node responsive to an assertion of the first dynamic data signal;
    a second transistor coupled to the first node and having a second control terminal, the second transistor configured to drive a second state on the first node responsive to a signal on the second control terminal;
    a circuit coupled to generate the signal on the second control terminal and coupled to receive a second dynamic data signal, the second dynamic data signal being a complement of the first dynamic data signal, wherein the circuit is configured to activate the second transistor responsive to an assertion of the second dynamic data signal; and
    a keeper coupled to the first node and configured to retain a previous state of the first node responsive to a deassertion of each of the first dynamic data signal and the second dynamic data signal.

11. The apparatus as recited in claim 10 wherein the keeper is coupled to receive an indication of an evaluate phase of the first and second dynamic data signals, and wherein the keeper is inactive during the evaluate phase.

12. The apparatus as recited in claim 1 wherein the circuit comprises an inverter.

13. A memory array comprising:
    a plurality of banks of memory, each bank configured to output a first dynamic data signal indicative of a bit stored in the bank and a second dynamic data signal indicative of the complement of the bit; and
    a bank select circuit coupled to receive the first dynamic data signal and the second dynamic data signal from each of the plurality of banks and configured to output a selected bit responsive to the first dynamic data signal and the second dynamic data signal from each of the plurality of banks, the bank select circuit comprising:
      a first plurality of transistors, each having a control terminal coupled to receive the first dynamic data signal from a respective one of the plurality of banks, wherein each of the first plurality of transistors is coupled to a first node and is configured to drive a first state on the first node responsive to an assertion of the first dynamic data signal;
      a second transistor coupled to the first node and having a second control terminal, the second transistor configured to drive a second state on the first node responsive to a signal on the second control terminal; and
      a circuit coupled to generate the signal on the second terminal and coupled to receive the second dynamic data signal from each of the plurality of banks, wherein the circuit is configured to activate the second transistor responsive to an assertion of the second dynamic data signal from one of the plurality of banks.

14. The memory array as recited in claim 13 further comprising a decoder coupled to each of the plurality of banks, wherein the decoder is configured to activate at most one of the plurality of banks to output data via the first dynamic data signal or the second dynamic data signal.

15. The memory array as recited in claim 13 wherein the bank select circuit further comprises an inverter having an input coupled to the first node and a driving the selected bit output from the bank select circuit.

16. The memory array as recited in claim 13 wherein the bank select circuit further comprises a keeper coupled to the first node and configured to retain a previous state of the first node responsive to a deassertion of each of first dynamic data signals and the second dynamic data signals.

17. The memory array as recited in claim 13 wherein the circuit performs a logical NOR of the second dynamic data signals from each of the plurality of banks.

18. The memory array as recited in claim 17 wherein the circuit is a NOR gate.

19. The memory array as recited in claim 13 wherein the bank select circuit further comprises a second plurality of transistors, each having a control terminal coupled to receive the second dynamic data signal from a respective one of the plurality of banks, and each of the second plurality of transistors coupled to the first node.

20. The memory array as recited in claim 19 wherein the second transistor is a PMOS transistor.

21. The memory array as recited in claim 20 wherein the second plurality of transistors are each NMOS transistors.

22. The memory array as recited in claim 21 wherein the first plurality of transistors are each NMOS transistors.

23. A computer accessible medium comprising one or more data structures representing:
  a first plurality of transistors, each having a control terminal coupled to receive a respective one of a first plurality of dynamic data signals, wherein each of the first plurality of transistors is coupled to a first node and is configured to drive a first state on the first node responsive to an assertion of the respective one of the first plurality of dynamic data signals;
  a second transistor coupled to the first node and having a second control terminal, the second transistor configured to drive a second state on the first node responsive to a signal on the second control terminal; and
  a circuit coupled to generate the signal on the second terminal and coupled to receive a second plurality of dynamic data signals, each of the second plurality of dynamic data signals being a complement of a respective one of the first plurality of dynamic data signals, wherein the circuit is configured to activate the second transistor responsive to an assertion of one of the second plurality of dynamic data signals.

24. The computer accessible medium as recited in claim 23 wherein the one or more data structures further represent a memory array, the memory array comprising:
  a plurality of banks of memory, each bank configured to output a first dynamic data signal indicative of a bit stored in the bank and a second dynamic data signal indicative of the complement of the bit; and
  a bank select circuit coupled to receive the first dynamic data signal and the second dynamic data signal from each of the plurality of banks and configured to output a selected bit responsive to the first dynamic data signal and the second dynamic data signal from each of the plurality of banks, the bank select circuit comprising the first plurality of transistors, the second transistor, and the circuit.

25. A computer accessible medium comprising one or more data structures representing:
  a source circuit configured to generate a first dynamic data signal and a second dynamic data signal that is a complement of the first dynamic data signal;
  a first transistor having a first control terminal coupled to receive the first dynamic data signal, wherein the first transistor is coupled to a first node and is configured to drive a first state on the first node responsive to an assertion of the first dynamic data signal;
  a second transistor coupled to the first node and having a second control terminal, the second transistor configured to drive a second state on the first node responsive to a signal on the second control terminal; and
  a circuit coupled to receive the second dynamic data signal, and configured to generate the signal on the second control terminal responsive to the second dynamic data signal, wherein the circuit is configured to activate the second transistor responsive to an assertion of the second dynamic data signal.

* * * * *